(12) United States Patent
Yamazaki et al.

(10) Patent No.: US 6,448,577 B1
(45) Date of Patent: *Sep. 10, 2002

(54) SEMICONDUCTOR DEVICE WITH GRAIN BOUNDARIES

(75) Inventors: Shunpei Yamazaki, Tokyo; Hongyong Zhang, Kanagawa, both of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/037,984

(22) Filed: Mar. 11, 1998

Related U.S. Application Data

(62) Division of application No. 08/428,842, filed on Apr. 25, 1995, now Pat. No. 5,744,818, which is a continuation of application No. 08/235,228, filed on Apr. 29, 1994, which is a continuation of application No. 08/001,544, filed on Jan. 6, 1993, which is a division of application No. 07/774,852, filed on Oct. 11, 1991, now Pat. No. 5,210,050.

(30) Foreign Application Priority Data

Oct. 15, 1990 (JP) ............................................. 2-277134
Oct. 15, 1990 (JP) ............................................. 2-277135

(51) Int. Cl.$^7$ ............................................. H01L 29/00
(52) U.S. Cl. ............................. 257/59; 257/60; 257/61; 257/62; 257/63; 257/64; 257/65; 257/66; 257/347; 257/348; 257/349; 257/350; 257/351; 257/352; 257/353; 257/354; 257/355
(58) Field of Search ....................... 257/59–66, 347–355

(56) References Cited

U.S. PATENT DOCUMENTS

| 4,068,020 A | 1/1978 | Reuschel ..................... 437/88 |
| 4,365,013 A | 12/1982 | Ishioka et al. ................ 430/57 |
| 4,378,417 A | 3/1983 | Maruyama et al. ........... 430/57 |

(List continued on next page.)

FOREIGN PATENT DOCUMENTS

| EP | 0161555 | 11/1985 | ................. 257/57 |
| GB | 2118774 A | 11/1983 | |
| JP | 53-27483 | 3/1978 | |
| JP | 01-103825 | 4/1980 | |
| JP | 57-99729 | 6/1982 | |
| JP | 57-122575 | 7/1982 | |

(List continued on next page.)

OTHER PUBLICATIONS

Tonouchi et al. "Characterization of $\mu$c–Si:H Films Prepared by Hz Sputtering." Japanese Journal of Applied Physics., vol. 29, No. 3, Mar. 1990, pp. L385–L387.

Sun et al. "Growth Temperature Dependence of $\mu$c–Si:H Films Sputtered with Hydrogen Gas." Japanese Journal of Applied Physics., vol. 29, No. 7, Jul. 1990, pp. L1029–L1032.

"Semiconductor Materials Handbook for Electron Devices", pp. 435–437, Jun. 26, 1986, (without translation.

*Primary Examiner*—Fetsum Abraham
(74) *Attorney, Agent, or Firm*—Eric J. Robinson; Robinson Intellectual Property Law Office, PC

(57) ABSTRACT

A high quality semiconductor device comprising at least a semiconductor film having a microcrystal structure is disclosed, wherein said semiconductor film has a lattice distortion therein and comprises crystal grains at an average diameter of 30 Å to 4 $\mu$m as viewed from the upper surface of said semiconductor film and contains oxygen impurity and concentration of said oxygen impurity is not higher than $7 \times 10^{19}$ atoms.cm$^{-3}$ at an inside position of said semiconductor film. Also is disclosed a method for fabricating semiconductor devices mentioned hereinbefore, which comprises depositing an amorphous semiconductor film containing oxygen impurity at a concentration not higher than $7 \times 10^{19}$ atoms.cm$^{-3}$ by sputtering from a semiconductor target containing oxygen impurity at a concentration not higher than $5 \times 10^{18}$ atoms.cm$^{-3}$ in an atmosphere comprising hydrogen at not less than 10% in terms of partial pressure; and crystallizing said amorphous semiconductor film at a temperature of from 450° C. to 700° C.

30 Claims, 5 Drawing Sheets

U.S. PATENT DOCUMENTS

| | | | |
|---|---|---|---|
| 4,464,415 A | 8/1984 | Yamazaki | |
| 4,591,892 A | 5/1986 | Yamazaki | 357/30 |
| 4,597,160 A | 7/1986 | Ipri | 148/DIG. 118 |
| 4,727,044 A | 2/1988 | Yamazaki | |
| 4,740,829 A | 4/1988 | Nakagiri et al. | 257/65 |
| 4,766,477 A | 8/1988 | Nakagawa et al. | |
| 4,860,069 A | 8/1989 | Yamazaki | 257/62 |
| 4,862,237 A | 8/1989 | Morizumi | 257/72 |
| 4,888,305 A | 12/1989 | Yamazaki et al. | 437/101 |
| 4,891,330 A | 1/1990 | Guha et al. | 437/2 |
| 4,897,360 A | 1/1990 | Guckel et al. | 257/417 |
| 4,959,700 A | 9/1990 | Yamazaki | |
| 4,969,025 A | 11/1990 | Yamamoto et al. | 357/30 |
| 4,969,031 A | 11/1990 | Kobayashi et al. | 257/64 |
| 4,986,213 A | 1/1991 | Yamazaki et al. | 118/725 |
| 5,077,223 A | 12/1991 | Yamazaki | 437/4 |
| 5,132,754 A | 7/1992 | Serikawa et al. | |
| 5,132,821 A | 7/1992 | Nicholas | 257/72 |
| 5,142,344 A | 8/1992 | Yamazaki | |
| 5,248,630 A | 9/1993 | Serikawa et al. | |
| 5,250,818 A | 10/1993 | Saraswat et al. | 257/66 |
| 5,340,999 A | 8/1994 | Takeda et al. | |
| 5,744,818 A * | 4/1998 | Yamazaki et al. | 257/57 |
| 5,859,443 A | 1/1999 | Yamazaki et al. | |
| 5,899,547 A | 5/1999 | Yamazaki et al. | |
| 5,946,059 A | 8/1999 | Yamazaki et al. | |
| 5,977,560 A * | 11/1999 | Banerjee et al. | 257/19 |

FOREIGN PATENT DOCUMENTS

| | | | |
|---|---|---|---|
| JP | 58-027364 | 2/1983 | |
| JP | 58-074080 | 5/1983 | |
| JP | 58-118154 | 7/1983 | |
| JP | 58-136037 | 8/1983 | |
| JP | 58-186967 | 11/1983 | |
| JP | 58-199564 | 11/1983 | |
| JP | 59-35015 | 2/1984 | |
| JP | 59-35423 | 2/1984 | |
| JP | 59-141271 | 8/1984 | |
| JP | 60-117687 | 6/1985 | |
| JP | 60-173828 | 9/1985 | |
| JP | 60-245174 | 12/1985 | |
| JP | 64-22060 | 1/1989 | |
| JP | 64-31466 | 2/1989 | |
| JP | 1-270310 | 10/1989 | |
| JP | 1-308018 | 12/1989 | |
| JP | 2-42765 | 2/1990 | |
| JP | 2-103925 | 4/1990 | 437/101 |
| JP | 02-189935 | 7/1990 | |
| JP | 2-194620 | 8/1990 | |
| JP | 2-209725 | 8/1990 | |

* cited by examiner

SEMICONDUCTOR DEVICE WITH GRAIN BOUNDARIES

This application is a Divisional of application Ser. No. 08/428,842, is now U.S. Pat. No. 5,744,818 filed Apr. 25, 1995; which itself is a continuation of Ser. No. 08/235,228, filed Apr. 29, 1994; which is a continuation of Ser. No. 08/001,544, filed Jan. 6, 1993; which is a divisional of Ser. No. 07/774,852 filed Oct. 11, 1991 (now U.S. Pat. No. 5,210,050).

BACKGROUND OF THE INVENTION

1. Field of the Invention

The present invention relates to a semiconductor device comprising at least a semiconductor film accompanying lattice distortion therein, and to a method for manufacturing the same.

2. Description of the Prior Art

Methods for fabricating polycrystalline semiconductor films to use in polycrystalline semiconductor devices include (1) depositing films in the temperature range of from 550 to 900° C. using low pressure CVD (chemical vapor deposition), (2) thermally crystallizing semiconductor films having deposited by low pressure CVD, by annealing the films in the temperature range of from 550 to 650° C. for a duration of from several to several tens of hours, and (3) thermally crystallizing semiconductor films having deposited by plasma-enhanced CVD, by annealing the films in the temperature range of from 550 to 650° C. for a duration of from several to several tens of hours.

However, in depositing a non-single crystal semiconductor film, a reduced pressure CVD method fails to deposit uniformly the film over a large area on a substrate, and a plasma CVD method takes too long a time to deposit the film to a sufficient thickness.

There is also known a method of fabricating thin-film transistors using an amorphous silicon (a-Si) film having deposited by sputtering in the presence of hydrogen, however, the electric characteristics of the resulting thin film are so poor as to yield, e.g., an electron mobility of 0.1 $cm^2/Vsec$ or even lower.

If a non-single crystal semiconductor film is deposited by a sputtering method under an atmosphere free from hydrogen, on the other hand, the resulting film suffers segregation of silicon atoms. Furthermore, it is known that such a film would not undergo thermal crystallization at 700° C. or at any temperature below 700° C., due to the incorporation of impurities such as argon and oxygen atoms or to the lack of hydrogen, or due to both.

SUMMARY OF THE INVENTION

An object of the present invention is to provide a semiconductor device improved in device characteristics.

Another object of the present invention is to provide a method for fabricating a semiconductor device improved in device characteristics.

Further another object of the present invention is to provide a semiconductor device comprising a microcrystalline semiconductor film having a low barrier at the grain boundaries thereof.

Still another object of the present invention is to provide a method for fabricating a semiconductor device comprising a semiconductor film having a low barrier at the grain boundaries thereof.

These and other objects of the present invention have been attained by the use of a semiconductor film having a lattice distortion therein and comprising crystal grains having an average diameter of from 30 Å to 4 μm, preferably from 30 Å to 400 Å, as viewed from the upper surface of said semiconductor film, and containing an oxygen impurity at a concentration of $7\times10^{19}$ $atoms.cm^{-3}$ or lower, preferably $1\times10^{19}$ $atoms.cm^{-3}$ or lower, inside said semiconductor film. Such a semiconductor film include a microcrystalline semiconductor film having a microcrystal structure and a polycrystalline semiconductor film. Microscopically, the crystals (grains) in the semiconductor film are more tightly brought into contact with the neighboring crystals (grains) by imparting lattice distortion to each of the crystals (grains). This results in the disappearance of barriers at the grain boundaries and in an enhanced carrier mobility.

The semiconductor film according to the present invention is different from a polycrystalline film free from lattice distortion, since in the latter film, impurities such as oxygen accumulate at the grain boundaries to develop a barrier which interferes the transfer of carriers. The film according to the present invention has no or negligible amount of barriers therein since the film has lattice distortion therein. Thus, the electron mobility of the film according to the present invention is extremely increased, as compared with that of a conventional semiconductor film, to from 5 to 300 $cm^2/Vsec$.

The concentration of hydrogen in the semiconductor film according to the present invention is preferably 5 atom % or less.

The semiconductor film according to the present invention is fabricated by first depositing an amorphous (or substantially amorphous) semiconductor film on a substrate by sputtering in a 100% hydrogen atmosphere or in an atmosphere containing hydrogen as the major component and an inactive gas, and then crystallizing said amorphous semiconductor film in the temperature range of from 450 to 700° C., typically at 600° C.

The present inventors have found through an extensive study that, by carrying out the sputtering process in a controlled atmosphere containing 0.01% or less oxygen and having added therein 10% or more (in terms of partial pressure) of hydrogen [having 5N (99.999%) or higher purity], an a-Si film having uniformly incorporated therein hydrogen could be deposited, and that this film was capable of being thermally crystallized by annealing in the temperature range of from 450 to 700° C., typically at 600° C. The present invention has been accomplished based on those findings.

In accordance with one aspect of the present invention, an amorphous semiconductor film containing oxygen impurity at a concentration of $7\times10^{19}$ $atoms.cm^{-3}$ or less is deposited by sputtering a semiconductor target containing oxygen impurity at a concentration of $5\times10^{18}$ $atoms.cm^{-3}$ or less, and the resulting film is then thermally crystallized.

In accordance with another aspect of the present invention, an amorphous semiconductor film is formed by sputtering a semiconductor target containing oxygen impurity at a concentration not higher than $5\times10^{18}$ $atoms.cm^{-3}$ in a chamber the inner pressure of which is adjusted to a suitable pressure for sputtering, preferably, in the pressure range of from $10^{-2}$ to $10^{-4}$ Torr, by introducing a gas consisting of 100% hydrogen or a mixed gas comprising hydrogen and an inactive gas into a chamber having evacuated to a pressure of $1\times10^{-6}$ Torr or lower, preferably to $1\times10^{-9}$ Torr or lower, and the resulting film is then thermally crystallized.

DETAILED DESCRIPTION OF THE PREFERRED EMBODIMENTS

EXAMPLE 1

Figure 1A:
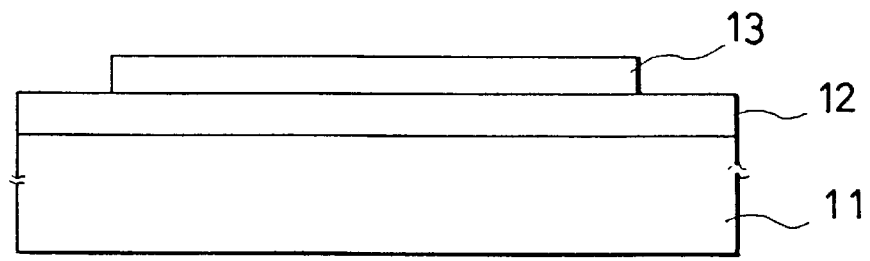
FIGS. 1(A) to 1(E) are cross sectional views which show the fabrication steps of the thin-film transistor (TFT) according to the present invention.

An amorphous silicon (a-Si) film is deposited using a radio-frequency (RF) or high frequency magnetron sputtering apparatus, and then recrystallized to obtain a polycrystalline silicon semiconductor film comprising quasi-crystals (or semi-amorphous film), said semiconductor film having induced therein lattice distortion, comprising crystal grains having an average diameter of from 30 Å to 4 μm, preferably from 30 Å to 400 Å, containing 5 atom % or less of hydrogen and an oxygen impurity at a concentration of $7\times10^{19}$ atoms.cm$^{-3}$ or lower, preferably $1\times10^{19}$ atoms.cm$^{-3}$ or lower.

Referring to FIGS. 1(A) to 1(E), the process for fabricating a TFT (thin film transistor) according to the present invention is described below.

A 200 nm thick silicon oxide film 12 is deposited on a glass substrate 11 by RF magnetron sputtering from a single crystal silicon target under conditions as follows:

| | |
|---|---|
| Atmosphere: | 100% O$_2$ |
| Film deposition temperature: | 150° C. |
| RF (13.56 MHz) output power: | 400 W |
| Pressure: | 0.5 Pa. |

On the silicon oxide film thus deposited is further deposited a 100 nm thick a-Si film 13 to provide a channel forming region, using an RF magnetron sputtering apparatus capable of depositing films with a low impurity concentration. The back pressure is controlled to $1\times10^{-6}$ Torr or lower, preferably to $1\times10^{-19}$ Torr or lower, by using a turbo-molecular pump and a cryopump. Gases having a purity of 5N (99.999%) or higher are supplied, and if necessary, a 4N or higher purity argon gas is used as an additive gas. The single crystal silicon to be used as the target should be also reduced in oxygen concentration to $5\times10^{18}$ atoms.cm$^{-3}$ or less, for example, to $1\times10^{18}$ atoms.cm$^{-3}$, to thereby control the oxygen impurity of the deposited film as low as possible. Deposition of the film is carried out in an atmosphere comprising from 10 to 100% of hydrogen and 90% or less of an inactive gas (e.g., argon). For example, film deposition may be conducted in a 100% hydrogen gas atmosphere. The film deposition is carried out by sputtering from a high purity silicon target under the conditions as follows:

| H$_2$/(H$_2$ + Ar) = 100% (partial pressure ratio) | |
|---|---|
| Film deposition temperature: | 150° C. |
| RF (13.56 MHz) output power: | 400 W |
| Total pressure: | 0.5 Pa. |

The a-Si film 13 thus obtained is then subjected to thermal crystallization by maintaining the film in a temperature range of from 450 to 700° C., e.g., at 600° C., for a duration of 10 hours in a hydrogen or an inert gas atmosphere. In the present example, a 100% hydrogen gas atmosphere is used. The crystallized film is a so-called microcrystalline (or semi-amorphous) film.

The a-Si film and the thermally crystallized film obtained therefrom in the present example were analysed by secondary-ion mass spectrometry (SIMS) for the impurity content. The oxygen content was found to be $8\times10^{18}$ atoms.cm$^{-3}$ and the carbon content was found to be $3\times10^{16}$ atoms.cm$^{-3}$ for the a-Si film. The hydrogen content was found to be $4\times10^{20}$ atoms.cm$^{-3}$ for the a-Si film; by taking the silicon density as $4\times10^{22}$ atoms.cm$^{-3}$, the amount of hydrogen corresponds to 1 atom %. The analyses were performed by taking the oxygen concentration of the single crystal silicon target, $1\times10^{18}$ atoms.cm$^{-3}$, as the standard, and the minimum value in the depth profile (concentration distribution along the direction vertical to the surface of the film) of the deposited film was taken as the representative value, since the surface of the film is easily oxidized by the atmosphere to form silicon oxide. These impurity content values remain substantially unchanged after the thermal crystallization, to give an oxygen impurity of $8\times10^{18}$ atoms.cm$^{-3}$ for the crystallized film. To further ascertain this, oxygen content was increased by adding, for example, 0.1 cc/sec or 10 cc/sec of N$_2$O gas flow during the film deposition. The oxygen content of the crystallized film increased to $1\times10^{20}$ atoms.cm$^{-3}$ or $4\times10^{20}$ atoms.cm$^{-3}$, corresponding to the amount of the added N$_2$O. However, those films having an increased oxygen content could only be crystallized by either elevating the annealing temperature to not lower than 700° C., or taking the annealing duration longer for 5 times or more than that of the process according to the present invention. From the viewpoint of an industrial process, a treatment at a temperature not higher than 700° C., preferably not higher than 600° C., is requisite considering the softening point of glass substrates, and it is also important to shorten the process time. However, it was found experimentally impossible to crystallize a-Si semiconductor films at 450° C. or lower by a mere reduction of the concentration of the impurities such as oxygen.

Furthermore, the present invention is realized by the use of a high quality sputtering apparatus. Thus, if a leak or some failure should occur to increase the oxygen concentration to $1\times10^{20}$ atoms.cm$^{-3}$ or higher during the film deposition, such high quality semiconductor films according to the present invention may not result.

It can be seen from the foregoing that a control of an oxygen impurity concentration to $7\times10^{19}$ atoms.cm$^{-3}$ or less within the semiconductor film and a crystallization of the film in the temperature range of from 450 to 700° C. are requisite for the realization of the present invention.

In fabricating films of germanium or of a compound semiconductor of germanium and silicon, the annealing temperature for crystallization may be lowered, by about 100° C. than the temperature range setforth above.

The thermally crystallized semiconductor films thus obtained comprise therein lattice distortion. The laser Raman spectra of such films yield peaks shifted to the lower wavenumber side as compared with the peak obtained in the spectrum for a single crystal silicon (see FIG. 4).

The fabrication process of an insulated gate field effect transistor (FET) is described below.

First, the thermally crystallized silicon semiconductor film according to the present invention is subjected to device-separation patterning to obtain a structure as shown in FIG. 1(A). Then, 50 nm thick n+ a-Si semiconductor films 14 are deposited on the thermally crystallized silicon semiconductor film 13 by RF magnetron sputtering from a single crystal silicon target (containing $1\times10^{18}$ atoms.cm$^{-3}$ of oxygen) in an atmosphere comprising, in terms of partial pressure, from 10 to 99% or higher hydrogen (80% in the present example), 90% or lower argon (19% in the present example), and from 0.1 to 10% PH$_3$ (1% in the present example), under conditions as follows:

| | |
|---|---|
| Film deposition temperature: | 150° C. |
| RF (13.56 MHz) output power: | 400 W |
| Total pressure: | 0.5 Pa. |

The n+ a-Si semiconductor film described above may otherwise be deposited by a PCVD process. Furthermore, after the formation of an active layer, doping of impurities such as boron (B), phosphorus (P), and arsenic (As) may be carried out by ion implantation to provide a source and a drain.

Figure 1B:
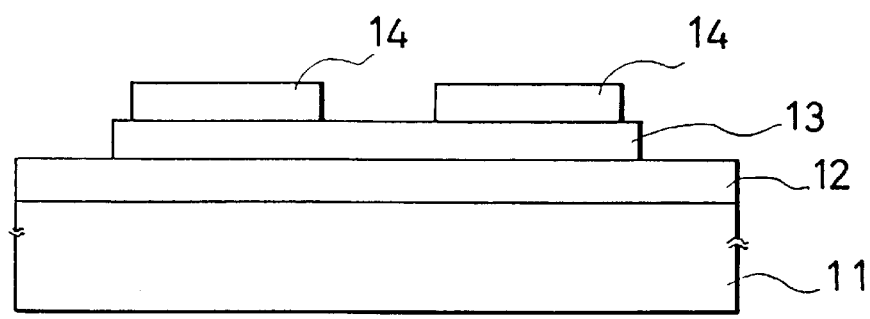
Figure 1C:
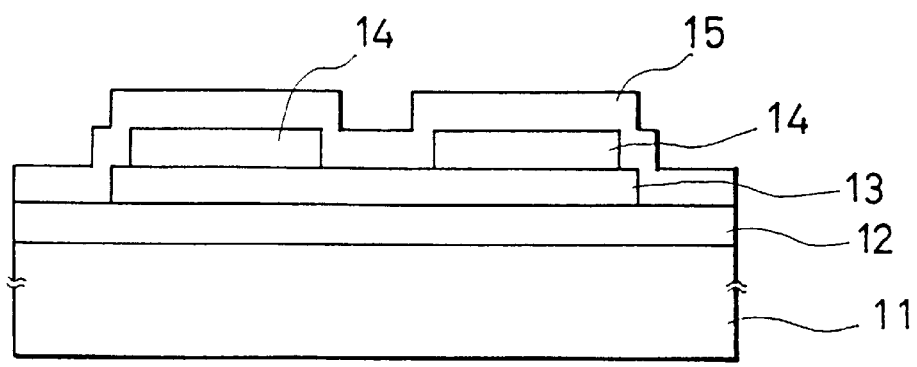

The n+ a-Si film 14 thus obtained is then patterned to obtain a structure as illustrated in FIG. 1(B). As shown in FIG. 1(C), a 100 nm thick silicon oxide film (gate insulator) 15 is deposited thereon by RF magnetron sputtering from a single crystal silicon target or a synthesized quartz target in 100% oxygen atmosphere, under conditions as follows:

| | |
|---|---|
| Film deposition temperature: | 100° C. |
| RF (13.56 MHz) output power: | 400 W |
| Total pressure: | 0.5 Pa. |

Figure 1D:
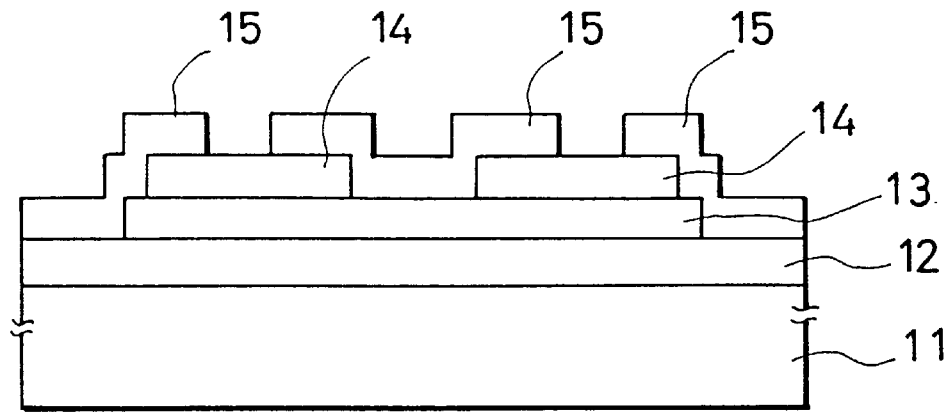
Figure 1E:
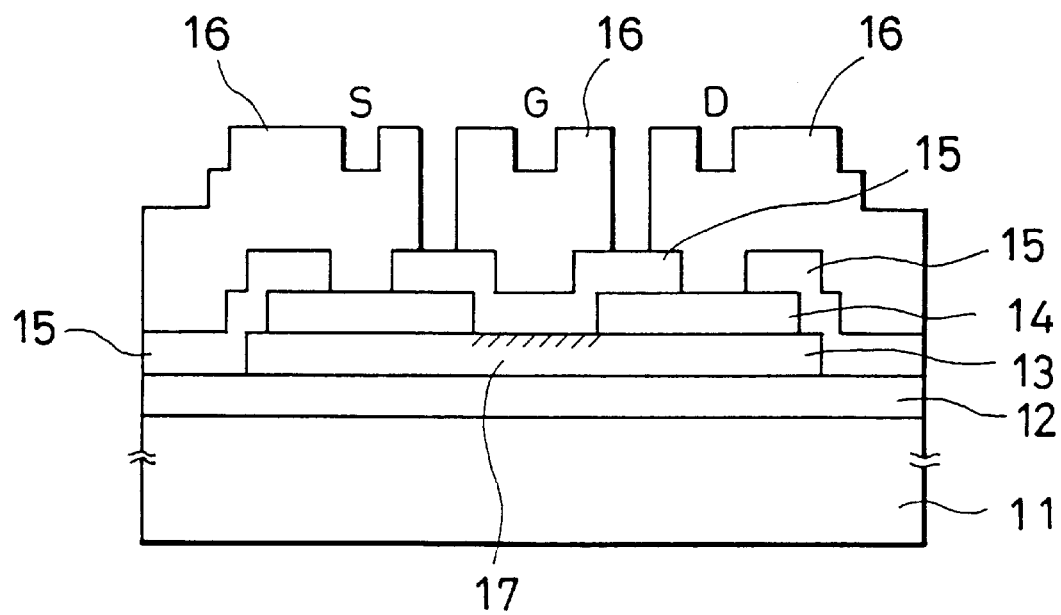

Next, contact holes are opened in the film by patterning as shown in FIG. 1(D). The TFT is finished to a structure as shown in FIG. 1(E) by depositing a 300 nm thick aluminum film 16 by vacuum deposition on the structure shown in FIG. 1(D), patterning the aluminum film, and thermally annealing the whole structure in 100% hydrogen at 375° C. for a duration of 30 minutes. The thermal annealing in hydrogen is applied to the device to improve the device characteristics by lowering the interface level between the thermally crystallized silicon semiconductor film and the silicon oxide insulator film.

Referring to the TFT shown in FIG. 1(E), S, G, and D represent a source electrode, a gate electrode, and a drain electrode, respectively. A 100×100 μm channel portion 17 (FIG. 1(E)) is provided in the TFT of the present example.

In addition to the foregoing example describing a process according to the present invention, four more examples to further illustrate the effect of the present invention are described below. TFTs are fabricated in the following Examples, with the conditions for depositing the a-Si layer 13 (see FIG. 1(A)) using RF magnetron sputtering being varied from an Example to another by changing the ratio of hydrogen in a sputtering atmosphere and the concentration of the oxygen involved in the deposited layer.

EXAMPLE 2

The same TFT fabrication process as in Example 1 is carried out, except for changing the atmospheric condition during the sputtering for depositing the channel forming region 13 in FIG. 1(A) to give a mixed gas ratio (in terms of partial pressure) as follows:

$H_2/(H_2+Ar)=0\%$

The deposited film thus obtained contained oxygen at a concentration of $2\times10^{20}$ atoms.cm$^{-3}$.

EXAMPLE 3

The same TFT fabrication process as in Example 1 is carried out, except for changing the atmospheric condition during the sputtering for depositing the channel forming region 13 in FIG. 1(A) to give a mixed gas ratio (in terms of partial pressure) as follows:

$H_2/(H_2+Ar)=20\%$

The deposited film thus obtained contained oxygen at a concentration of $7\times10^{19}$ atoms.cm$^{-3}$.

EXAMPLE 4

The same TFT fabrication process as in Example 1 is carried out, except for changing the atmospheric condition during the sputtering for depositing the channel forming region 13 in FIG. 1(A) to give a mixed gas ratio (in terms of partial pressure) as follows:

$H_2/(H_2+Ar)=50\%$

The deposited film thus obtained contained oxygen at a concentration of $3\times10^{19}$ atoms.cm$^{-3}$.

EXAMPLE 5

The same TFT fabrication process as in Example 1 is carried out, except for changing the atmospheric condition during the sputtering for depositing the channel forming region 13 in FIG. 1(A) to give a mixed gas ratio (in terms of partial pressure) as follows:

$H_2/(H_2+Ar)=80\%$

The deposited film thus obtained contained oxygen at a concentration of $1\times10^{19}$ atoms.cm$^{-3}$ The electric properties of the films obtained in the foregoing Examples are compared below.

Figure 2:
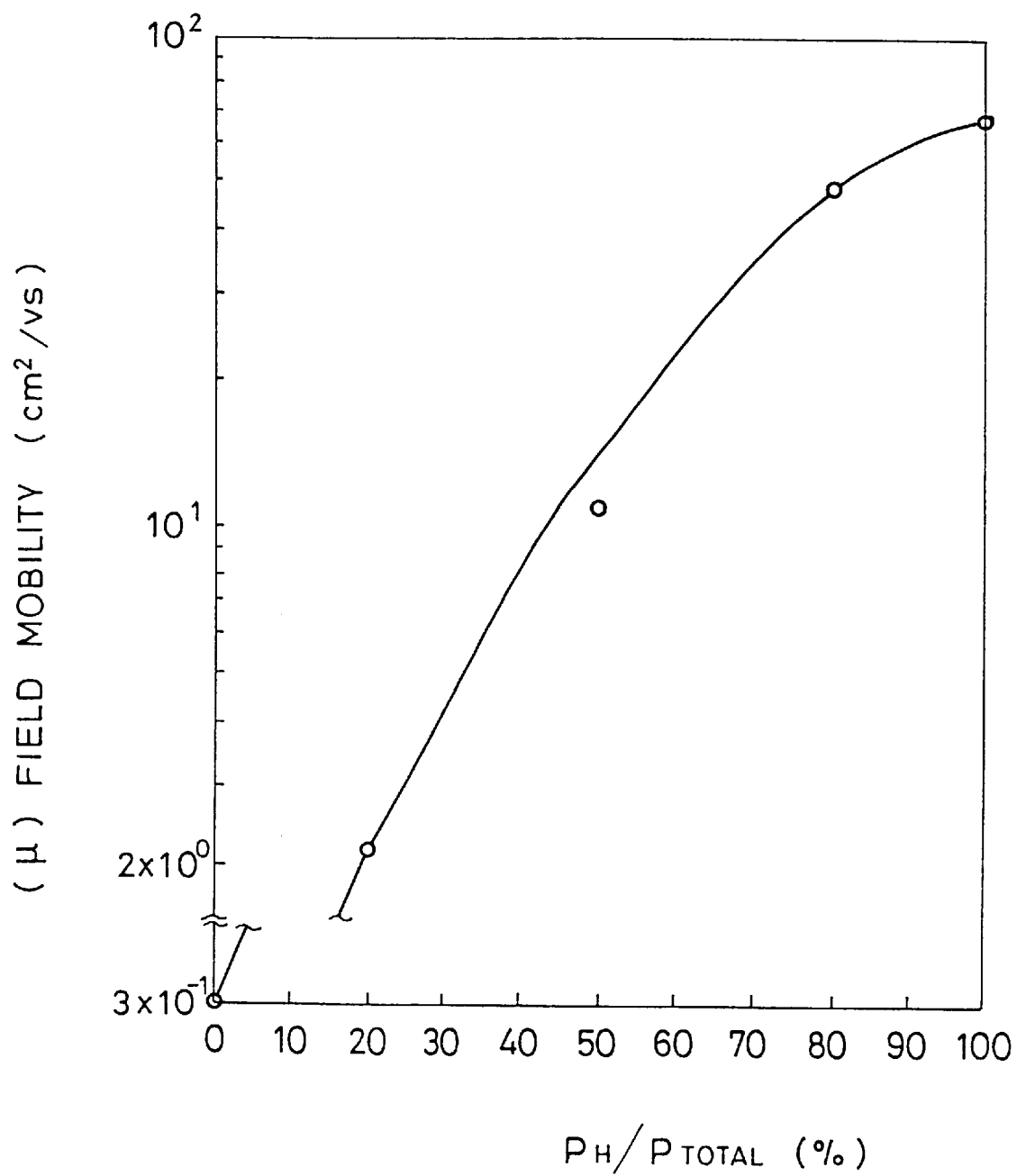
FIG. 2 is a diagram which relates the field mobility of the TFT to the ratio of hydrogen partial pressure to total atmospheric pressure ($P_H/P_{TOTAL}$) during sputtering.

FIG. 2 is a diagram which shows the relation between the carrier field mobility, λ, in the channel portion (indicated with numeral 17 in FIG. 1(E)) of each of the TFTs of Examples 1 to 5, and the hydrogen partial pressure ratio ($P_H/P_{TOTAL}=H_2/(H_2+Ar)$). The plots in FIG. 2 and their corresponding Examples are listed in Table 1 below.

TABLE 1

| $P_H/P_{TOTAL}$ (%) | No. of Example |
|---|---|
| 0 | 2 |
| 20 | 3 |
| 50 | 4 |
| 80 | 5 |
| 100 | 1 |

Referring to FIG. 2, the film deposited under a hydrogen partial pressure of 0% yields a field mobility, A, as low as $3\times10^{-1}$ cm$^2$/Vsec, since the oxygen concentration of the film is as high as $2\times10^{20}$ atoms.cm$^{-3}$. In contrast, a noticeably high field mobility, μ, of 2 cm$^2$/Vsec or even higher can be obtained in the films which are deposited under a hydrogen partial pressure of 20% or higher and have an oxygen concentration of $7\times10^{19}$ atoms.cm$^{-3}$ or less. Such an effect is assumably ascribed to the addition of hydrogen and to the use of a cryopump; that is, the hydrogen reacts with oxygen inside the chamber during the sputtering to yield water, and the resulting water is then effectively removed by the cryopump.

Figure 3:
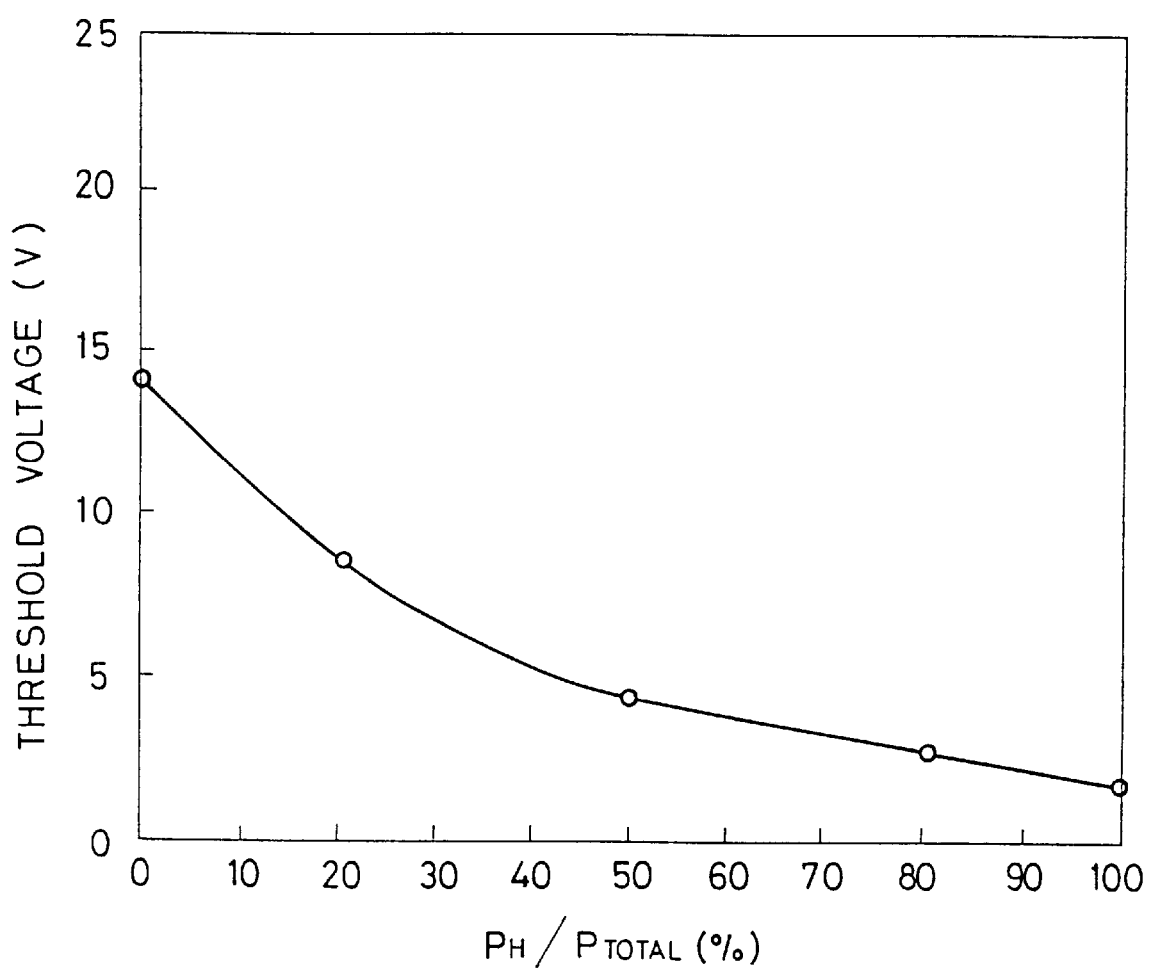
FIG. 3 is a diagram which relates the threshold voltage of the TFT to the ratio of hydrogen partial pressure to total atmospheric pressure ($P_H/P_{TOTAL}$) during sputtering.

Referring to FIG. 3, a diagram which relates the threshold voltage to the hydrogen partial pressure ratio ($P_H/P_{TOTAL}$= $H_2/(H_2+Ar)$) is shown. The hydrogen partial pressure ratio ($P_H/P_{TOTAL}$=$H_2/(H_2+Ar)$) and the corresponding number of the Example can be found in Table 1 above. The lower the threshold voltage, the lower can be achieved the gate voltage. It can be said, therefore, the lower threshold voltage, the more favorable as a device. According to the results shown in FIG. 3, a normally off state with a threshold voltage of 8V or lower is obtained on a film having deposited by a sputtering conducted under an atmosphere containing high hydrogen partial pressure of 20% or more. This signifies that devices (TFTs in the present examples) which yield favorable electric characteristics can be obtained by using a silicon semiconductor film having obtained by crystallizing an a-Si film once deposited as the channel forming region 13 as shown in FIG. 1(A).

Figure 4:
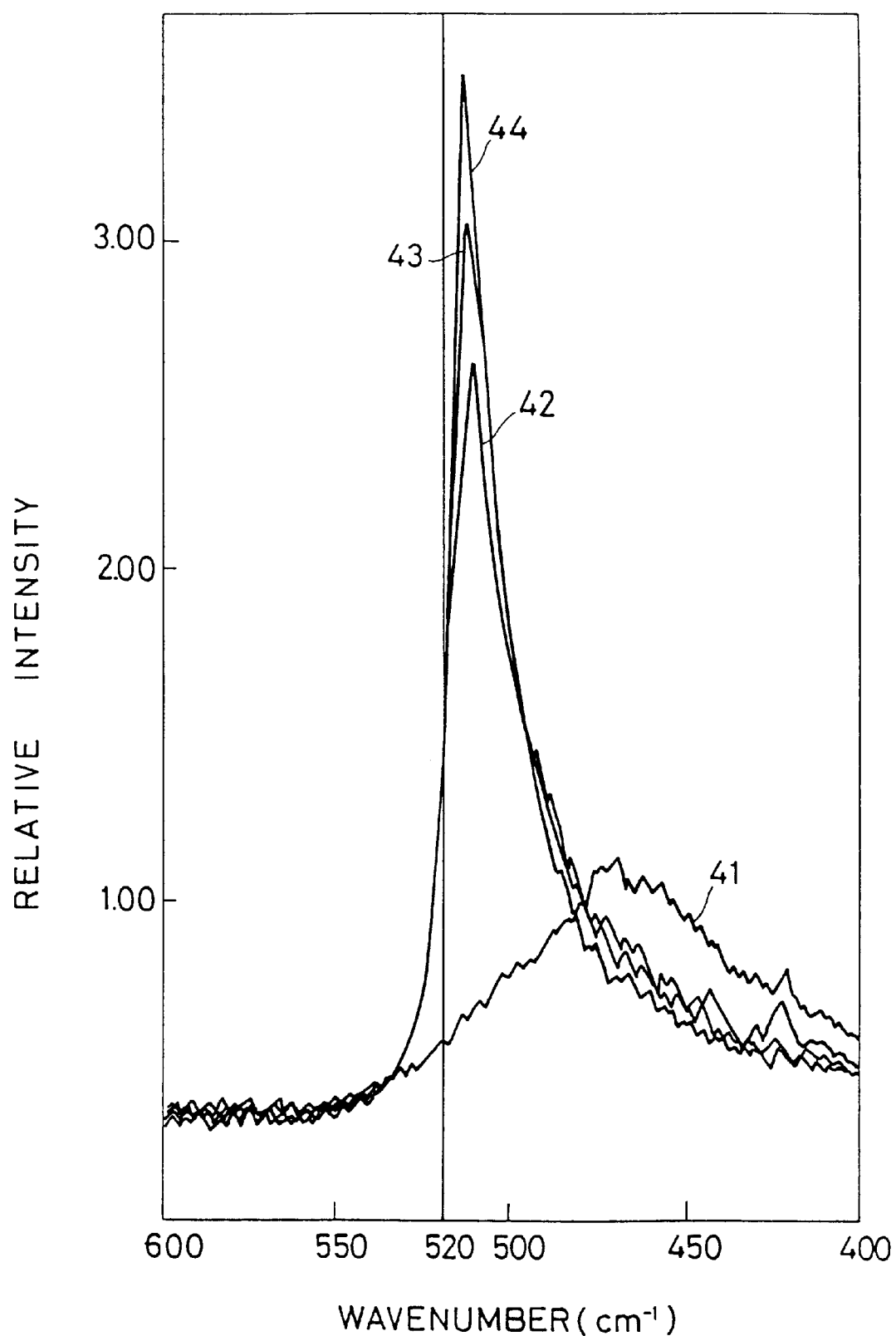
FIG. 4 shows laser Raman spectra of the thermally crystallized silicon semiconductor film.

In FIG. 4 are given laser Raman spectra of the silicon semiconductor films obtained by thermally crystallizing a-Si films. The numerals attached to the spectra in the FIGURE, the corresponding number of the Examples and the hydrogen partial pressure used therein are listed in Table 2 below.

TABLE 2

| Numerals in the FIGURE | No. of Examples | Hydrogen Partial Pressure |
| --- | --- | --- |
| 41 | 2 | 0% |
| 42 | 3 | 20% |
| 43 | 4 | 50% |
| 44 | 1 | 100% |

In FIG. 4, by comparing the spectrum 43 or 44 with the spectrum 42 or 41, it can be seen that the film sputtered under 100% hydrogen apparently crystallizes to yield crystal grains of high crystallinity as observed by its Raman spectrum, said grains having an average diameter of from 30 to 400 Å, preferably in the average diameter range of from 100 to 200 Å, as calculated from the half band width of the spectrum. Since the peak value of this film is shifted to the lower wavenumber side with respect to the peak (520 cm$^{-1}$) of a single crystal silicon, it is also clear that a lattice distortion is imparted to the grains. Those results most clearly show the characteristics of the present invention. That is, the a-Si film deposited by sputtering under an atmosphere in the presence of hydrogen has effect only when it is subjected to thermal crystallization. Since the lattice of the crystal grains are distorted, the fine crystals impose a compression force to each other. This signifies that a more intimate contact of the grains is realized at the grain boundaries; thus, the accumulation of impurities such as oxygen and the development of an energy barrier for carriers become less liable to occur at such grain boundaries. Accordingly, a high carrier field mobility can be expected in such films.

The thermally crystallized semiconductor film in accordance with the present invention can also be characterized by an average diameter calculated from half band width of X-ray diffraction spectrum thereof instead of the half band width of Raman spectrum described above. The average diameter calculated from half band width of X-ray diffraction spectrum of the thermally crystallized semiconductor film in accordance with the present invention is from 30 Å to 4 μm, preferably from 30 Å to 400 Å.

Generally in a TFT which is a field effect transistor, the drain current $I_D$ can be related to the drain voltage $V_D$ by the following equation if the drain voltage $V_D$ is low [ *Solid State Electronics*, Vol.24, No.11, (1981) pp.1059, printed in Britain];

$$I_D = (W/L)\mu C(V_G - V_T)V_D$$

wherein, W represents the channel width, L represents the channel length, μ represents the field mobility, C represents the capacity of the gate oxide film, $V_G$ represents the gate voltage, and $V_T$ represents the threshold voltage.

In the foregoing examples, Ar (argon) was used as the inactive gas at the sputtering. However, the inactive gas is not limited thereto and other gases such as He (helium); also, plasmas of reactive gases such as $SiH_4$ and $Si_2H_6$ may be added to the sputtering atmosphere partially. The a-Si film may be deposited by RF magnetron sputtering under any condition as desired, provided that each of the conditions satisfy the following range: a hydrogen partial pressure ratio of from 10 to 100%, a film deposition temperature of from room temperature to 500° C., an RF output of from 500 to 100 GHz, and an output power of from 100 W to 10 MW. Furthermore, the sputtering apparatus may be combined with a pulsed energy generator. A powerful light beam (having a wavelength in the range of from 100 to 500 nm) may further be irradiated simultaneously to conduct photo-sputtering.

The processes proposed above enable formation of a hydrogen plasma from a light-weight atom hydrogen to thereby efficiently produce positive ions useful in sputtering. In such a way, hydrogen or a hydrogen atom may be uniformly dispersed in the film during deposition by sputtering, which results in a film reduced in oxygen content to 7×10$^{19}$ atoms.cm$^{-3}$ or less, preferably to 1×10$^{19}$ atoms.cm$^{-3}$ or less. Furthermore, the reactive gasses mentioned hereinbefore can be used in these processes as well.

In the foregoing Examples, an a-Si film was used as the amorphous semiconductor film. However, the present invention is also applicable to a film of a germanium or compound semiconductor represented by $Si_xGe_{1-x}$ (0<x<1). These films may be a p-type, an n-type, or an intrinsic semiconductor.

While the invention has been described in detail and with reference to specific embodiments thereof, it will be apparent to one skilled in the art that various changes and modifications can be made therein without departing from the spirit and scope thereof.

What is claimed is:

1. An insulated gate field effect semiconductor device comprising:
   at least a crystalline semiconductor island formed over a glass substrate, said semiconductor island comprising an active region of said device; and
   a gate electrode provided adjacent to said semiconductor island with an insulating film therebetween, said insulating film comprising silicon oxide,
   wherein said semiconductor island comprises silicon having a channel region and having a grain structure with crystal grains at an average diameter of 30 Å to 4 μm as calculated from a half band width of one of a Raman Spectrum and an X-ray diffraction of said film, an electron mobility of 5 cm$^2$/Vsec or larger and contains an oxygen concentration not higher than 7×10$^{19}$ atoms/cm$^3$ within said semiconductor film,
   wherein a Raman spectrum of at least the channel region of said semiconductor film shows a peak shifted to a lower wavenumber side with respect to 520 cm$^{-1}$, and wherein said insulating film extends beyond side edges of said semiconductor island.

2. The semiconductor device of claim 1 wherein said semiconductor film contains hydrogen at not more than 5 atom %.

3. The semiconductor device of claim 1 wherein said semiconductor island comprises a semiconductor selected from the group consisting of a p-type semiconductor, an n-type semiconductor, and an intrinsic semiconductor.

4. The device of claim 1, wherein said insulating film extends over a portion of said glass substrate other than that over which said semiconductor island is formed.

5. The device of claim 1 wherein said gate electrode is located over said semiconductor island.

6. The device of claim 1 wherein said gate electrode comprises aluminum.

7. The semiconductor device of claim 1, wherein said semiconductor island comprises a material selected from the group consisting of silicon, germanium and $Si_xGe_{1-x}$ (0<x<1).

8. The semiconductor device of claim 1, wherein said semiconductor island comprises a compound semiconductor $Si_xGe_{1-x}$ (0<x<1).

9. The semiconductor device of claim 1, wherein said semiconductor island includes substantially no barriers therein since crystals within said island include lattice distortion.

10. The semiconductor device of claim 1 further comprising a film comprising silicon oxide interposed between said glass substrate and said semiconductor island.

11. An insulated gate field effect transistor comprising:
a crystalline semiconductor island comprising silicon and germanium formed over an insulating surface, said semiconductor island having a channel region and an electron mobility of 5 cm$^2$/Vsec or larger;
a gate electrode provided adjacent to said semiconductor island with an insulating film therebetween; said insulating film comprising silicon oxide:
wherein the Raman spectrum of at least the channel region of said semiconductor island shows a peak shifted to a lower wavenumber side with respect to 520 cm$^{-1}$; and
wherein said insulating film extends beyond side edges of said semiconductor island so that a portion of said insulating surface surrounding said semiconductor island is covered by said insulating film.

12. An insulated gate field effect transistor according to claim 11, wherein a source electrode and a drain electrode are connected to source or drain regions of the transistor through at least one opening in the insulating film and wherein said insulating film directly covers the entire surface of the semiconductor island except at the connection of the source and drain electrodes to the semiconductor island.

13. The insulated gate field effect semiconductor device of claim 11, wherein said semiconductor island includes substantially no barriers therein since crystals within said island include lattice distortion.

14. The insulated gate field effect semiconductor device according to claim 11 wherein said gate electrode is located over said semiconductor island.

15. An insulated gate field effect transistor comprising:
a crystalline semiconductor island comprising silicon and germanium provided over an insulating surface said semiconductor island having a channel region;
a gate electrode provided adjacent to said semiconductor island with an insulating film therebetween;
wherein the Raman spectrum of at least the channel region of said semiconductor island shows a peak shifted to a lower wavenumber side with respect to 520 cm$^{-1}$; and
wherein said insulating film comprises silicon oxide and extends outwardly beyond side edges of said semiconductor island and on a region of said insulating surface other than that on which said semiconductor island is provided.

16. The device according to claim 15 wherein said insulating surface comprises silicon oxide.

17. An insulated gate field effect semiconductor device comprising:
a crystalline semiconductor island comprising crystalline silicon formed on an insulating surface;
a channel region formed in said semiconductor island;
an insulating film including a gate insulating film formed on said semiconductor island and said insulating surface, wherein said insulating film comprising silicon oxide,
a gate electrode formed over said channel region with said gate insulating film interposed therebetween,
wherein an average grain diameter of crystal grains in said semiconductor island as calculated from a half band width of one of a Raman Spectrum and an X-ray diffraction is 30 Å to 4 μm, an electron mobility of said semiconductor island is of 5 cm$^2$/Vsec or larger, and an oxygen concentration in said semiconductor island is not higher than 7×10$^{19}$ atoms/cm$^{-3}$, and
wherein a Raman spectrum of at least the channel region of said semiconductor island shows a peak shifted to a lower wavenumber side with respect to 520 cm$^{-1}$.

18. The semiconductor device according to claim 17 wherein said semiconductor island contains hydrogen at not more than 5 atom %.

19. A insulated gate field effect semiconductor device comprising:
a semiconductor island comprising $Si_xGe_{1-x}$ (0<x<1) formed on an insulating surface;
a channel region formed in said semiconductor island;
an insulating film comprising silicon oxide including a gate insulating film formed on said semiconductor island and said insulating surface;
a gate electrode formed over said channel region with said gate insulating film interposed therebetween,
wherein an oxygen concentration in said semiconductor island is not higher than 7×10$^{19}$ atoms/cm$^{-3}$, and
wherein a Raman spectrum of at least the channel region of said semiconductor island shows a peak shifted to a lower wavenumber side with respect to 520 cm$^{-1}$.

20. The semiconductor device according to claim 19 wherein said semiconductor island contains hydrogen at not more than 5 atom %.

21. An insulated gate field effect semiconductor device comprising:
a semiconductor island comprising crystalline silicon formed on an insulating surface, said semiconductor island having grain boundaries;
a channel region formed in said semiconductor island;
an insulating film including a gate insulating film formed on said semiconductor island and said insulating surface;
a gate electrode formed over said channel region with said gate insulating film interposed therebetween,
wherein there is substantially no barrier against carriers at said grain boundaries and there is no oxygen accumulation at said grain boundaries.

22. The semiconductor device according to claim 21 wherein said semiconductor island has an electron mobility from 5 to 300 cm$^2$/Vsec.

23. The semiconductor device according to claim 21 wherein an oxygen concentration in said semiconductor island is not higher than $7\times10^{19}$ atoms/cm$^3$.

24. An insulated gate field effect semiconductor device comprising:

a semiconductor island comprising crystalline silicon formed on an insulating surface, said semiconductor island having grain boundaries;

a channel region formed in said semiconductor island;

an insulating film comprising silicon oxide including a gate insulating film formed on said semiconductor island and said insulating surface;

a gate electrode formed over said channel region with said gate insulating film interposed therebetween, wherein there is a substantially no barrier against carriers at said grain boundaries and an oxygen concentration in said semiconductor island is not higher than $7\times10^{19}$ atoms/cm$^{-3}$.

25. The semiconductor device according to claim 24 wherein said semiconductor island has an electron mobility from 5 to 300 cm$^2$/Vsec.

26. An insulated gate field effect semiconductor device comprising:

at least a crystalline semiconductor island formed over a glass substrate, said semiconductor island comprising silicon and having a channel region; and a gate electrode provided adjacent to said semiconductor island with an insulating film therebetween said insulating film comprising silicon oxide, wherein said semiconductor island contains oxygen at a concentration not higher than $7\times10^{19}$ atoms/cm$^{-3}$ and hydrogen at not more than 5 atom % and an electron mobility of the insulated gate field effect semiconductor device is 5 cm$^2$/Vsec or larger, wherein a Raman spectrum of at least the channel region of said semiconductor film shows a peak shifted to a lower wavenumber side with respect to 520 cm$^{-1}$.

27. The device of claim 26 wherein said gate electrode is located over said semiconductor island.

28. The semiconductor device of claim 27 wherein said semiconductor island comprises a material selected from the group consisting of silicon, germanium and Si$_x$Ge$_{1-x}$ (0<x<1).

29. The semiconductor device of claim 26 wherein said semiconductor island includes substantially no barriers therein since crystals within said island include lattice distortion.

30. The semiconductor device of claim 26 further comprising a film comprising silicon oxide interposed between said glass substrate and said semiconductor island.

* * * * *